(12) United States Patent
Katti

(10) Patent No.: US 7,068,531 B2
(45) Date of Patent: Jun. 27, 2006

(54) BIAS-ADJUSTED MAGNETORESISTIVE DEVICES FOR MAGNETIC RANDOM ACCESS MEMORY (MRAM) APPLICATIONS

(75) Inventor: Romney R. Katti, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 195 days.

(21) Appl. No.: 10/754,935

(22) Filed: Jan. 10, 2004

(65) Prior Publication Data

US 2005/0152179 A1   Jul. 14, 2005

(51) Int. Cl.
*G11C 11/00* (2006.01)

(52) U.S. Cl. .................. 365/158; 365/171; 365/173

(58) Field of Classification Search .................. None
See application file for complete search history.

(56) References Cited

U.S. PATENT DOCUMENTS

| | | | |
|---|---|---|---|
| 5,515,314 A * | 5/1996 | Kouhei et al. ............. 365/158 |
| 6,147,922 A | 11/2000 | Hurst |
| 6,175,525 B1 | 1/2001 | Fulkerson |
| 6,178,111 B1 | 1/2001 | Sather |
| 6,215,695 B1 * | 4/2001 | Ikeda .......................... 365/158 |
| 6,404,671 B1 * | 6/2002 | Reohr et al. ................. 365/158 |
| 6,493,258 B1 | 12/2002 | Lu |
| 6,522,573 B1 * | 2/2003 | Saito et al. ................. 365/158 |
| 6,859,388 B1 * | 2/2005 | Nahas et al. ................. 365/158 |
| 6,865,109 B1 * | 3/2005 | Covington .................... 365/173 |
| 6,888,742 B1 * | 5/2005 | Nguyen et al. ............. 365/158 |
| 6,912,152 B1 * | 6/2005 | Iwata et al. ................. 365/158 |
| 2002/0176277 A1 | 11/2002 | Bessho et al. .............. 365/171 |
| 2005/0078501 A1 | 4/2005 | Bangert ....................... 365/129 |

FOREIGN PATENT DOCUMENTS

| EP | 0 685 849 A2 | 6/1995 | ............... 95/49 |
|---|---|---|---|
| WO | WO 03/02945 A2 | 3/2003 | |

OTHER PUBLICATIONS

Daughton, "Magnetoresistive Random Access Memory (MRAM)," pp. 1-13 (Feb. 4, 2000).
International Search Report, Mailed May 30, 2005.

* cited by examiner

Primary Examiner—David Lam
(74) Attorney, Agent, or Firm—McDonnell Boehnen Hulbert & Berghoff LLP

(57) ABSTRACT

A method and apparatus are presented for shifting a hysteresis loop of a magnetoresistive device. For example, a method provides for applying a bias current to a word line of the magnetoresistive device during either a read sequence or a write sequence. The bias current is preferably configured to substantially center a hysteresis loop of the device without switching a binary state of the device.

25 Claims, 12 Drawing Sheets

BIAS-ADJUSTED MAGNETORESISTIVE DEVICES FOR MAGNETIC RANDOM ACCESS MEMORY (MRAM) APPLICATIONS

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetoresistive devices and, more particularly, to magnetoresistive devices for magnetic random access memory applications.

2. Related Art

The discovery of the giant magnetoresistive (GMR) effect and the magnetic tunneling junction (MTJ) effect have led to the development of a number of spin-based electronic devices.

The GMR and MTJ effects are observed in certain thin-film devices that are made up of alternating ferromagnetic and nonmagnetic layers. The resistance of a typical device is lowest when the magnetic moments of the ferromagnetic layers are in a parallel orientation and highest when the magnetic moments are in an antiparallel orientation.

One type of GMR device is commonly referred to as a "spin valve." A spin valve typically includes two ferromagnetic layers that are separated by a thin layer of a non-magnetic metal (usually copper) and also includes an anti-ferromagnetic layer that "pins" the magnetization of one of the ferromagnetic layers. FIG. 1 illustrates (in a simplified form) the layers in a typical spin valve 10. As shown in FIG. 1, spin valve 10 includes ferromagnetic layers 12 and 14 separated by a nonmagnetic layer 16. Ferromagnetic layer 14 is adjacent to an anti-ferromagnetic layer 18, such that the magnetization of ferromagnetic layer 14 is "pinned" in a particular orientation. The arrow in layer 14 indicates an exemplary pinned orientation, though, in general, the orientation could be pinned in either direction. Thus, the magnetization of ferromagnetic layer 14 remains relatively fixed when moderate magnetic fields are applied to spin valve 10. In contrast, the magnetization of ferromagnetic layer 12 is free to switch between parallel and antiparallel orientations, as indicated by the double-arrow symbol in layer 12. Thus, by applying an appropriate magnetic field to spin valve 10, the magnetization of ferromagnetic layer 12 can be changed while the magnetization of ferromagnetic layer 14 remains the same. In this way, applied magnetic fields can change the relative orientations of the magnetizations in ferromagnetic layers 12 and 14, which, in turn, can be detected as a change in resistance across the device. In particular, the resistance of spin valve 10 is typically lowest when the magnetizations of ferromagnetic layers 12 and 14 are parallel and highest when the magnetizations are antiparallel. For clarity, a first direction being antiparallel to a second direction indicates that the first direction is rotated 180 degrees from the second direction. During a read sequence, a read current (i) is passed across the spin valve as shown. Because the read current (i) flows parallel to the layers, a spin valve is known as a current-in-plane (CIP) device.

The layers of the GMR device may be formed using various techniques, including, for example, ion beam deposition, sputtering, plasma vapor deposition, evaporation, and/or molecular beam epitaxy.

The pseudo spin valve (PSV) is a second memory technology that uses the magnetoresistive effect to store data in a nonvolatile form. Like a spin valve, a pseudo spin valve typically includes two ferromagnetic layers that are separated by a layer of a nonmagnetic metal. The basic structure of the PSV is shown in FIG. 2 as a tri-layer device having a conducting spacer layer 26 separating a magnetic sense layer 22 from a magnetic storage layer 24. Each of the two magnetic layers has an associated magnetization direction along an easy axis of the PSV. The logical state of the PSV is determined by the magnetization direction of the reference layer.

In the PSV, the sense layer 22 is configured to switch its magnetization direction in response to the application of a magnetic field of at least a first threshold. Likewise, the storage layer 24 will switch its magnetization direction in response to the application of a magnetic field of at least a second threshold. The second threshold is generally higher than the first threshold—thus the magnetization direction of the sense layer 22 is easier to switch than the magnetization direction of the storage layer 24. Because the storage layer 24 has a higher switching threshold than the sense layer 22, the storage layer 24 is said to have a higher coercivity than sense layer 22. A double headed arrow at both sense layer 22 and storage layer 24 indicate that the respective magnetization directions of the layers may be inverted by an applied magnetic field.

The logical state of the PSV is determined by the magnetization direction of the storage layer 24. Thus, during a write sequence, a magnetic field of at least the second threshold must be applied to the PSV in order to switch its logical state. During a read sequence, a read current (i) is passed across the PSV. Because the read current (i) flows parallel to the layers, a PSV is also a CIP device.

Like GMR devices, MTJ devices typically include two ferromagnetic layers. In MTJ devices, the two ferromagnetic layers are separated by a thin tunneling barrier. As shown in FIG. 3, MTJ 30 includes ferromagnetic layers 32 and 34 separated by a non-magnetic, non-conducting barrier layer 36. Ferromagnetic layer 34 is configured such that its magnetization is "pinned" to a particular orientation. The arrow in layer 34 indicates an exemplary pinned orientation, though, in general, the orientation could be pinned in either direction. Thus, the magnetization of ferromagnetic layer 34 remains relatively fixed when moderate magnetic fields are applied to the MTJ 30. In contrast, the magnetization of ferromagnetic layer 32 is free to switch between parallel and antiparallel orientations relative to the fixed layer 34, as indicated by the double-arrow symbol in layer 32. Thus, by applying an appropriate magnetic field to MTJ 30, the magnetization of ferromagnetic layer 32 can be changed while the magnetization of ferromagnetic layer 34 remains the same. In this way, applied magnetic fields can change the relative orientations of the magnetizations in ferromagnetic layers 32 and 34, which, in turn, can be detected as a change in resistance. In particular, the resistance across MTJ 30 is typically lowest when the magnetizations of ferromagnetic layers 32 and 34 are parallel and highest when the magnetizations are antiparallel.

Usually, the resistivity of an MTJ is determined by measuring a read current passed perpendicularly through each layer of the MTJ. A read current (i) is shown passing perpendicularly through the layers of FIG. 3. Because of the direction of read current flow, an MTJ is termed a current perpendicular to plane (CPP) device.

GMR devices, including spin valves and pseudo spin valves, as well as MTJ devices, can be used as data storage elements in magnetic random access memory (MRAM) devices. In this regard, exemplary MRAM applications of GMR devices are described in U.S. Pat. Nos. 6,147,922; 6,175,525; 6,178,111; and 6,493,258, all of which are incorporated herein by reference. In typical MRAM devices, the logical state of a magnetoresistive memory element is based on its resistance, which, in turn, is based on the relative orientations of the magnetizations of the ferromagnetic layers. Thus, in one logical state, e.g., a "0" state, a magnetoresistive device may have its ferromagnetic layers in a parallel orientation and, thus, may exhibit a low electrical resistance. In the other logical state, e.g., a "1" state, the magnetoresistive device may align its ferromagnetic layers in an antiparallel orientation and, thus, may exhibit a higher electrical resistance. Data may be written to a magnetoresistive memory element by applying a magnetic field sufficient to change the magnetization of the "free" ferromagnetic layer, i.e., ferromagnetic layer 12 in spin valve 10 and ferromagnetic layer 32 in MTJ 30. In this way, the "free" ferromagnetic layer functions as a "switching layer" that stores data in the form of a particular magnetization orientation relative to the other ferromagnetic layer, the "reference layer." Thus, in spin valve 10, ferromagnetic layer 12 may function as the switching layer, and ferromagnetic layer 14 may function as the reference layer.

The magnetic fields used to write data to a magnetoresistive memory element in an MRAM device are typically generated by a "word" current flowing in a nearby conductor. For example, a word current flowing in one direction may be used to place the magnetoresistive memory element in one logical state, and a word current flowing in the other direction may be used to place the magnetoresistive memory element in the other logical state. In a further embodiment, during a write cycle, a second current may additionally be passed through another conductor aligned near the memory element such as a sense line or a bit line, for example. The second current creates a second magnetic field. The second magnetic field generally has an additive effect on the magnetic field created by the word current and further enables switching the logical state of the magnetoresistive memory element.

In addition, for redundancy and better signal sensing, some of the common MRAM cells include two magnetoresistive elements that are in opposite logical states. Thus, to change the state of the two magnetoresistive devices in the memory element, the word current is often arranged to apply magnetic fields of the same magnitude but opposite sign to the two magnetoresistive devices. Because of magnetic hysteresis, the switching layer may retain its magnetization orientation relative to the reference layer even when the word current stops and the magnetic field that the current generated is no longer present. In this way, little or no power may be needed in order for a magnetoresistive memory element to retain its logical state. Accordingly, MRAM devices are generally regarded to be a form of non-volatile data storage.

One difficulty with conventional GMR and MTJ devices for MRAM applications, e.g., for write and/or read operations, depending on the architecture, is that the hysteresis curve for the device is often substantially asymmetric or biased with respect to an applied magnetic field.

FIG. 4 illustrates such an asymmetric hysteresis curve. In FIG. 4, the vertical axis represents the resistance of an exemplary magnetoresistive device, and the horizontal axis represents an applied magnetic field. This magnetoresistive device exhibits a resistance $R_1$ in zero applied magnetic field, after a magnetic field $H_1$ is applied, and exhibits a resistance $R_0$ in zero applied magnetic field, after a magnetic field $H_0$ is applied. Thus, $R_1$ may represent the resistance of the GMR device in the "1" state, and $R_0$ may represent the resistance of the GMR in the "0" state.

Several disadvantages may result from this asymmetric hysteresis curve. First, because the hysteresis curve is not centered about zero applied magnetic field, the difference between the two zero-field resistances, $R_1$ and $R_0$, may be much smaller than the maximum possible resistance difference possible that the GMR device can exhibit. Second, the asymmetry of the hysteresis curve may cause higher word currents to be required for reliable operation. In particular, since word currents of the same magnitude but different directions are typically used to write data to the GMR devices in an MRAM memory element, a word current that generates an applied magnetic field with magnitude $H_0$ may be insufficient. Flowing in one direction, the word current may be able to place the GMR device in the "0" state with resistance $R_0$. However, when flowing in the other direction, the word current may be unable to place the GMR device in the "1" state with resistance $R_1$. Instead, a higher word current, sufficient to generate an applied magnetic field of magnitude $H_1$ may be required for reliable operation.

Accordingly, there is a need for magnetoresistive devices that exhibit hysteresis characteristics that are more compatible with MRAM applications.

SUMMARY

In a first aspect, an embodiment provides a method of applying a bias current to a word line in a magnetoresistive memory device such as a giant magnetoresistive (GMR) device or a magnetic tunnel junction (MTJ) device. The bias current is intended to create a magnetic field along an easy axis of a magnetoresistive (MR) element (also known as a bit) in order to shift the hysteresis characteristics of the MR element during either a read sequence or a write sequence. Because there is a possibility that the bias current can unintentionally cause the MR element to switch its binary state, an embodiment of the method also includes a feedback loop. The feedback loop operates by first determining whether the bias current caused the MR element to switch its state. Then, if it is determined that the MR element switched its state, the feedback loop triggers a rewrite of the MR element to restore its original state. In a preferred embodiment, however, the state of the MR element is held constant while applying the bias current.

In a second aspect, an embodiment provides an MR device with shifted hysteresis characteristics. The architecture of the MR device is centered on an MR element. In a preferred embodiment, the MR element can take the form of a spin valve, a pseudo-spin valve, or an MTJ such as those shown in FIGS. 1–3, for example. A word line is deposited near the MR element so that a current flowing through the word line creates a magnetic field acting on the MR element. An output of a write driver is electrically connected to the word line and provides a write current for switching the magnetization state of the MR element. An output of a bias driver is also electrically connected to the word line and provides a bias current to the word line. Additionally, an embodiment provides a data storage medium for storing the state of the MR element prior to applying the bias current, a comparator for comparing the stored prior-state with the state of the MR element after applying the bias current, and a rewrite trigger for resetting the state of the MR element to the prior-state.

A third aspect provides a redundant MR device comprising two MR elements, a pair of bit lines (one coupled with each element), a word line aligned near the two MR elements such that a current in the word line will apply magnetic fields of equal magnitude but opposite direction to the two MR elements, a bias driver connected to the word line, and a write driver connected to the word line. The bias driver is configured to create a bias current in the word line of sufficient magnitude to substantially center the hysteresis loops of the two MR elements. An embodiment with a feedback loop is also provided for resetting MR elements that were switched by the bias current.

A fourth aspect provides a MR memory array with a plurality of MR memory cells arranged in rows and columns. Each row of memory cells has a bit line that is coupled to each memory cell in the row. Similarly, each column has a word line that is arranged near each memory cell in the column such that a current in the word line creates a magnetic field acting along an easy axis of the memory cells. Both a write driver and a bias driver are electrically connected to one or more of the plurality of word lines. The bias driver is configured to generate a bias current for centering a biased hysteresis loop of a selected memory cell. In an embodiment, the write driver is configured to generate either a first current with a first magnitude and direction or a second current with the same magnitude but opposite direction. Further, an additional embodiment provides a write line that interconnects the output of the write driver with the output of the bias driver. The write line is interconnected with a selected word line through a switch.

These and other aspects and advantages will become apparent to those of ordinary skill in the art by reading the following detailed description, with reference where appropriate to the accompanying drawings.

DETAILED DESCRIPTION OF EXEMPLARY EMBODIMENTS

1. Overview

Figure 1:
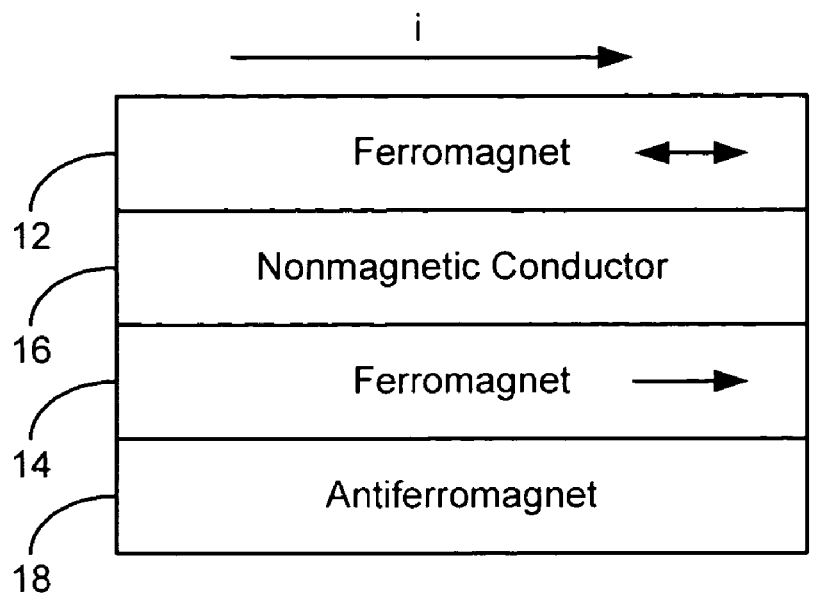
FIG. 1 is a schematic view of the layers of a prior art spin valve device.
Figure 2:
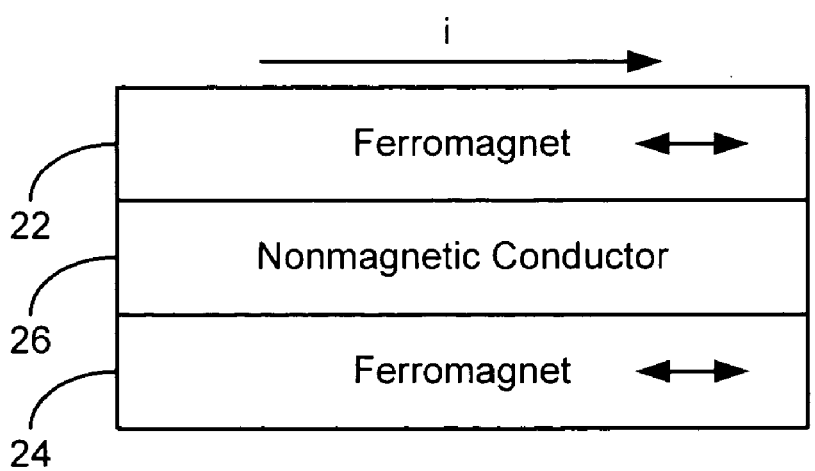
FIG. 2 is a schematic view of the layers of a prior art pseudo spin valve device.
Figure 3:
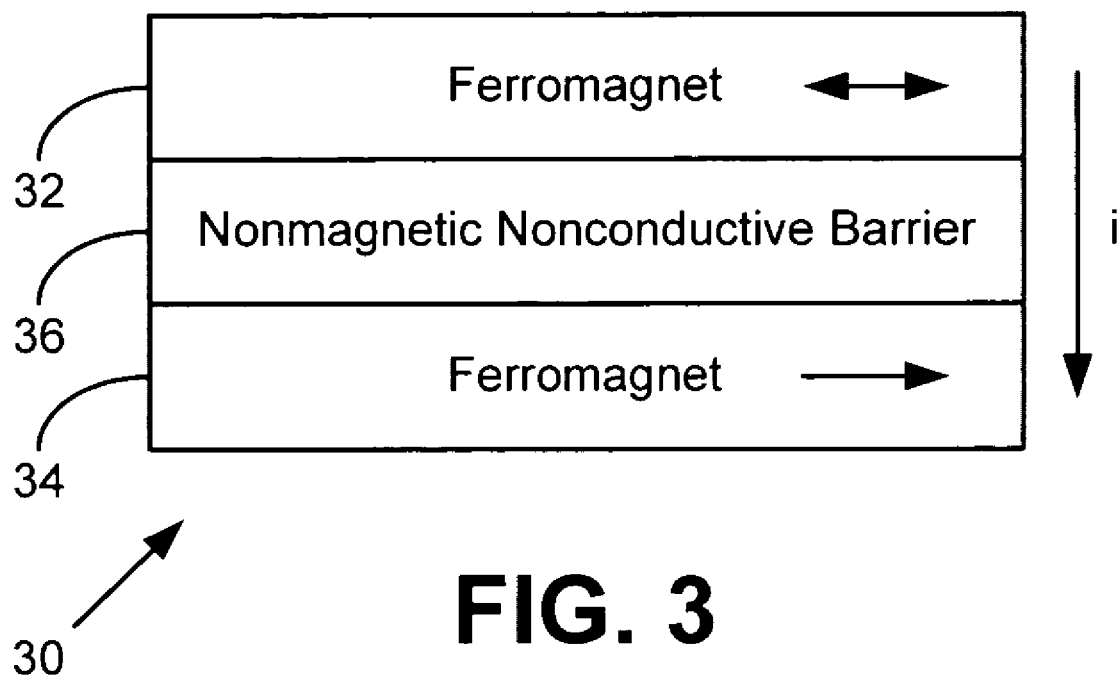
FIG. 3 is a schematic view of the layers of a prior art magnetic tunneling junction device.
Figure 4:
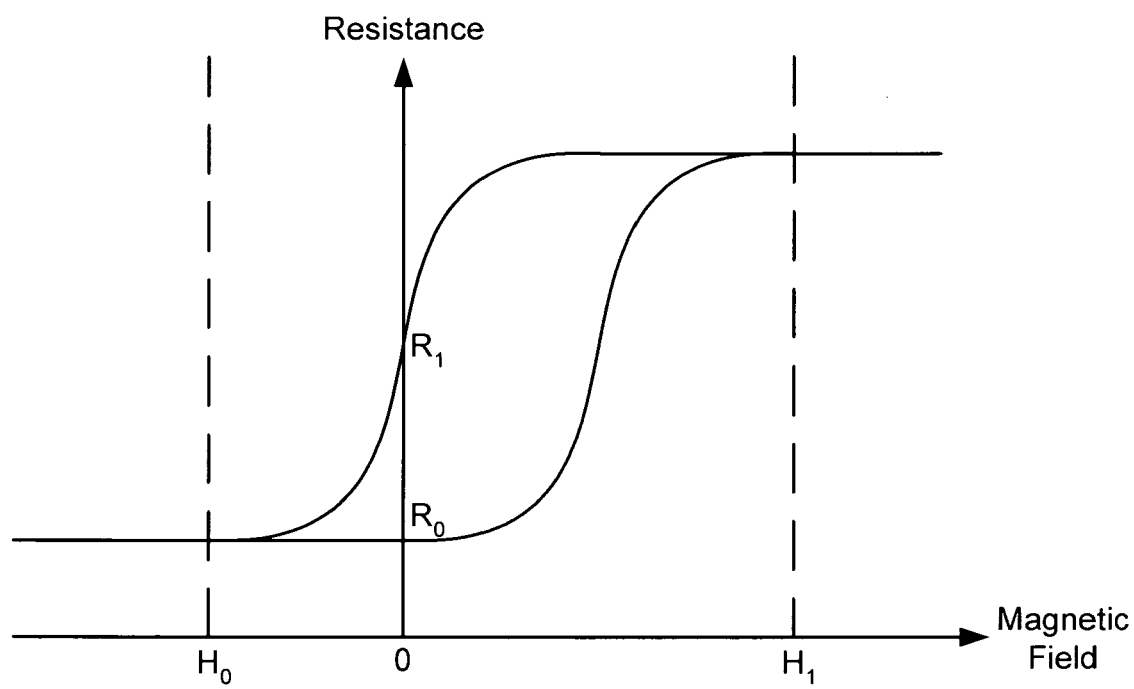
FIG. 4 is a graph of resistance versus applied magnetic field, showing a hysteresis curve of a prior art magnetoresistive device.
Figure 5:
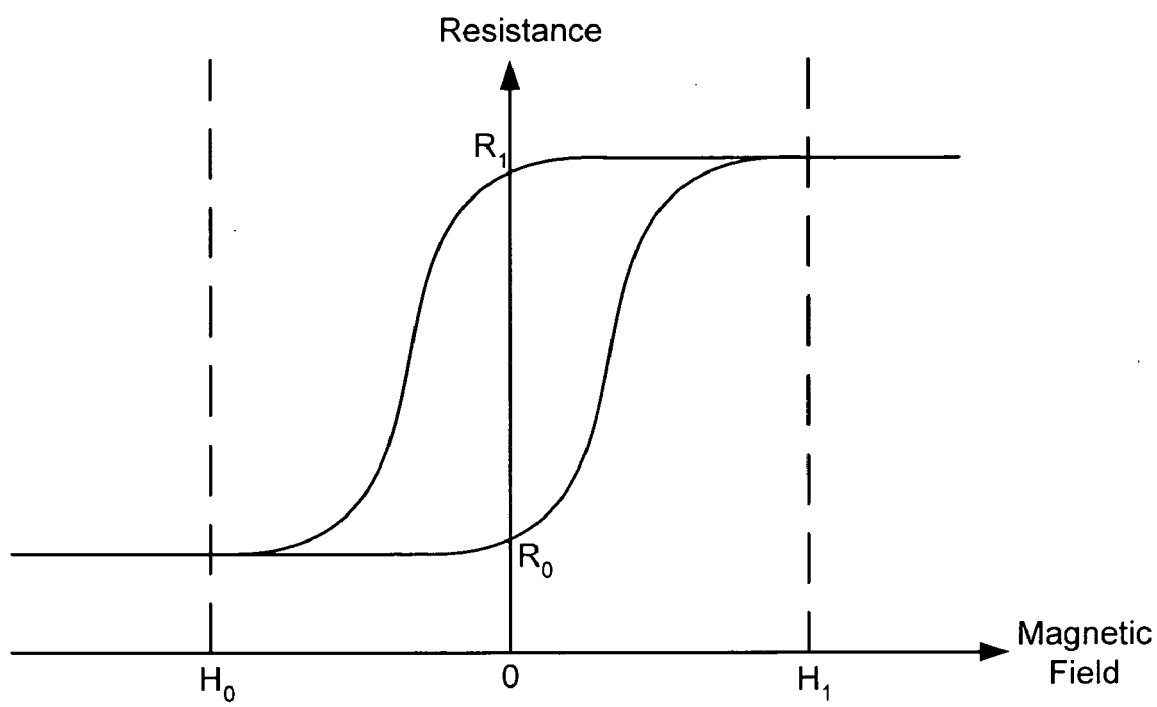
FIG. 5 is a graph of resistance versus applied magnetic field, showing a hysteresis curve of a magnetoresistive device, in accordance with an embodiment.

A preferred embodiment provides for GMR devices, such as spin valves, pseudo spin valves, or MJTs with hysteresis curves that are shifted to appear substantially symmetric about zero applied magnetic field. FIG. 5 shows an example of such a substantially symmetric hysteresis curve. As shown in FIG. 5, the difference between the highest resistance and lowest resistance is maximal at near zero applied magnetic field. The highest zero-field resistance, $R_1$, may be achieved by applying and then removing magnetic field, $H_1$, and the lowest zero-field resistance, $R_0$, may be achieved by applying and then removing magnetic field $H_0$. In other words, the symmetric hysteresis curve of FIG. 5 has a greater magnetoresistive effect than the biased curve of FIG. 4 where the magnetoresistive effect is defined by $(\Delta R/R_{min})$. Ideally, $H_1$ and $H_0$ represent magnetic fields of the same magnitude but opposite direction, so that they can be generated by the same word current flowing in opposite directions. Although FIG. 5 illustrates a perfectly symmetric hysteresis curve, it is to be understood that MR devices with hysteresis curves that are substantially, though not perfectly, symmetric can also result in good performance in MRAM applications.

In accordance with the preferred embodiment, a bias current is applied to a word line of an MR device. The bias current creates a magnetic field that acts in opposition to the asymmetric magnetic field of the MR device to compensate for the asymmetry.

2. Exemplary Magnetoresistive Memory Device

Figure 6:
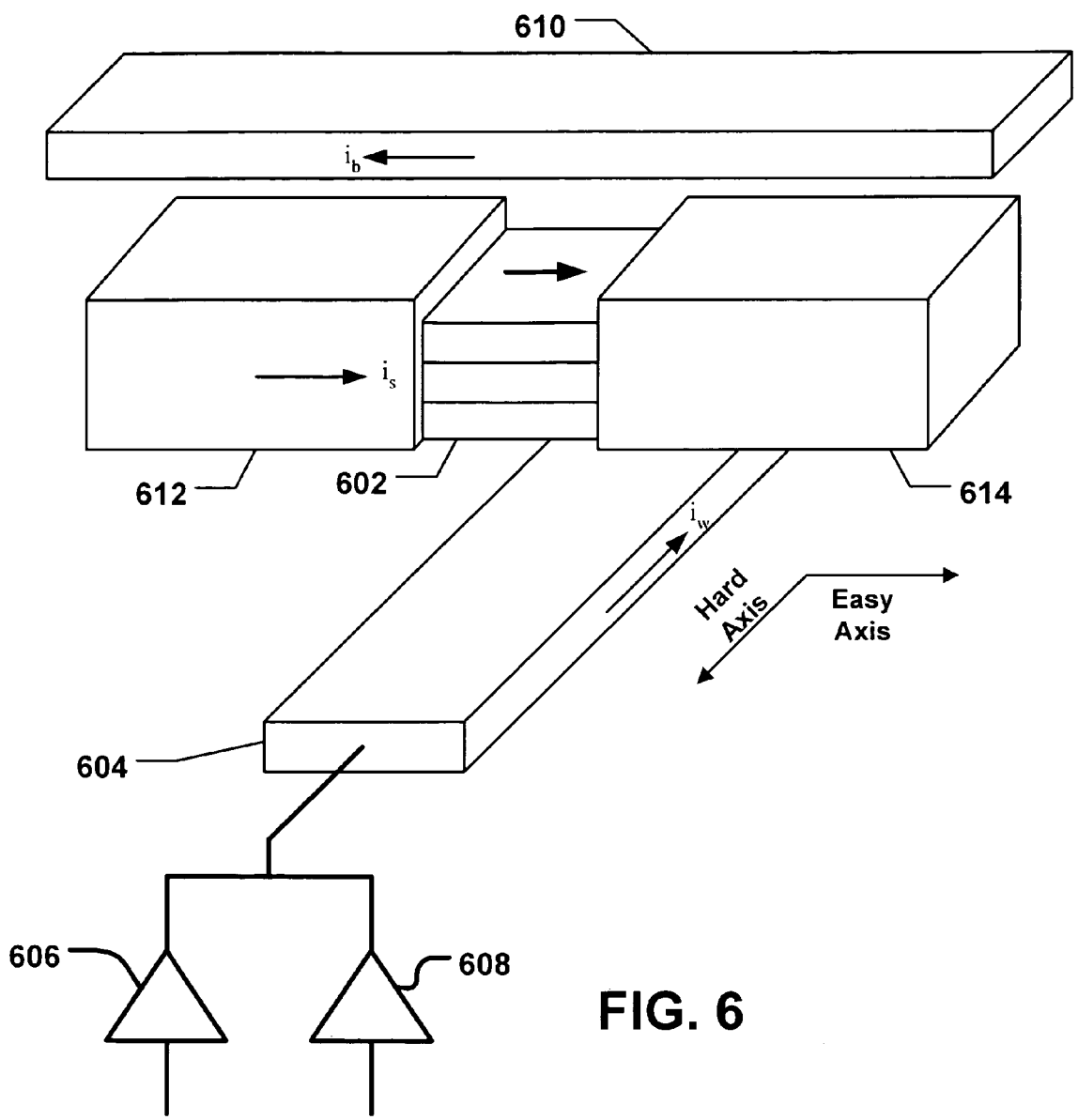
FIG. 6 is an isometric view of a current in plane (CIP) memory device in accordance with an embodiment.

FIG. 6 shows an isometric view of an exemplary current-in-plane (CIP) magnetoresistive (MR) device. In this embodiment, a MR element 602 is shown as a tri-layer element having a nonmagnetic layer sandwiched between two ferromagnetic layers. The MR element has a hard axis (short axis) and an easy axis (long axis). A word line 604 is arranged near the MR element 602. As shown, the word line 604 runs along the hard axis. An insulator (not shown) separates the word line 604 from the MR element 602. The output of both a write driver 608 and a bias driver 606 are electrically connected to the word line 604. A word current ($i_w$) is shown passing through the word line 604. A bit line 610 is arranged the near the MR element 602. The bit line 610 is insulated from the MR element 602. As shown, the bit line 610 runs along the easy axis and is perpendicular to the word line 604. A bit current ($i_b$) is shown passing through the bit line 610. A first sense line 612 and a second sense line 614 abut the MR element 602. Generally, the two sense lines 612 and 614 are electrically connected to opposite edges of the nonmagnetic layer of the MR element 602.

The relative magnetization directions of the ferromagnetic layers of the MR element 602 define a logical state of the MR device. In this embodiment, an arrow is shown on one side of the MR element 602 showing an example magnetization direction of one of the layers along the easy axis. In this example, the magnetization direction of that layer is to the right. Alternatively, the example magnetization direction could be shown pointing to the left. The alternative directions would represent two logical states of the MR device.

The arrangement of the word line 604 and bit line 610 are such that a current passing through either (or both) will create a magnetic field acting on the MR element 602. A magnetic field created by a current passing through a line has a magnetic direction perpendicular to the flow of the current according to the "right hand rule" of elementary physics.

The word line 604 is arranged so that a current passing through it will create a first magnetic field along the easy axis of the MR element 602. Likewise, the bit line 610 is arranged so that a current passing through it will create a second magnetic field along the hard axis of the MR element 602. The two magnetic fields additively combine to form a composite magnetic field that acts on the MR element 602. During a write sequence, a composite magnetic field is created to invert the magnetization direction of at least one layer of the MR element 602.

In an embodiment, the configuration of the word line 604 and bit line 610 is designed such that a current through a single line will not switch the magnetization direction of a layer of the MR element. This may be termed a "half-select" system, whereby each line "half-selects" the MR element 602 for writing. When both "write" lines 604 and 610 are providing a current then the two "half-selects" additively combine to fully select the MR element. When the MR element is thus selected, the magnetization direction of a layer of the MR element is switched.

In a preferred embodiment, the word line 604 and bit line 610 are planar conducting lines that have a substantially greater width than height. The widths of the word line 604 and bit line 610 are merely shown as examples, various widths of each line is possible and the widths should be adjusted according to design parameters such as the MR element used and board size.

In a further embodiment, a current is passed through the sense lines 612 and 614 to contribute further magnetic fields for switching the logical state of the MR device. As shown, a sense current ($i_s$) passing from the fist sense line 612 to the second sense line 614 will flow parallel to the layers of the MR element 602. Because of the direction of sense current ($i_s$) flow, the MR element shown is a current in plane (CIP) device.

In FIG. 6, the MR element is shown positioned orthogonally to the word line 604 and bit line 610. This positioning is not required. In another embodiment, for example, the MR device is rotated by 30 degrees to achieve a better switching performance. In general, the MR device may be configured at any rotation to, for example, alter read or write characteristics.

The MR device is configured such that during a read sequence, a sense current ($i_s$) is passed from the from the first sense line 612 to the second sense line 614 through the MR element 602. The sense current ($i_s$) is used to obtain a metric that is indicative of the resistance across the MR element 602.

The write driver 608 is configured to generate a current in the word line 604 for switching the state of the MR element 602, while the bias driver 606 is configured to a current in the word line 604 for shifting an asymmetric hysteresis characteristic of the MR element 602 without causing the MR element 602 to switch its state. A net current is passed through the word line 604 when both the write driver 608 and bias driver 606 are in operation. In a preferred embodiment, the write driver 608 has two possible output currents of equal magnitude but opposite direction. For example, a current of +/−50 mA may create a sufficient magnetic field to a spin valve element such that it switches its logical state. (e.g. to "half-select" the MR element 602). This symmetry can simplify manufacturing of the driver as well as simplify control circuitry.

Also in a preferred embodiment, the bias driver 606 has one possible output current. It is not necessary, however, for the bias driver 606 to continuously deliver a bias current to the word line. Specifically, application of bias current to center the hysteresis loop of the MR element may be limited to the duration of read and write sequences. During a write sequence, the centering of the hysteresis loop better ensures proper switching, and allows for the current driver to be configured with only one possible output current magnitude with the current direction depending on whether a "1" or "0" is being written. Similarly, during a read sequence, the centering of the hysteresis loop better ensures proper reading of the logical state of the MR element 602, and generates a greater magnetoresistive effect. As a specific example, a current of 15 mA may create a bias field of sufficient magnitude to correct a biased hysteresis loop of the MR element. More broadly, an approximate range for the bias current may be given at 5 mA to 40 mA for a GMR spin valve. The value for the bias current will depend upon the type of MR element 602 used in the device and other design parameters. Additionally, the value of the bias current may depend upon whether it is being applied during a read sequence or during a write sequence.

In an embodiment, there are three possible net current values passing through the word line 604: (1) bias+write, (2) bias−write, and (3) bias alone. The first two net current values (1) and (2) represent application of a current for switching the magnetization direction of a layer of the MR element 602. Thus, in (1), the bias is applied to center a write hysteresis loop of the MR element 602 and a positive write current is applied to switch the magnetization direction of a layer of the MR element 602 to a first direction. In (2), the bias is again applied to center a write hysteresis loop of the MR element 602 and a negative write current is applied to switch the magnetization direction of a layer of the MR element 602 to a second direction. Generally, the first direction is opposite to the second direction and represents a different logical state of the MR device. The bias current applied in (3) is applied without a write current and is useful for centering a read hysteresis loop of the MR element 602 during a read sequence. Except in cases of device or other error, a bias current generally has insufficient magnitude on its own to flip the logical state of the device.

In another embodiment, there are more possible net currents. For example, in an embodiment where the MR element is a pseudo spin valve (PSV) a magnetic field of a first threshold is required to switch the magnetization direction of one of the ferromagnetic layers (a sense layer) while a magnetic field of a second threshold is requires to switch the magnetization direction of another of the ferromagnetic layers (a storage layer). Thus, in this embodiment the device may be configured for carrying five possible currents along the word line 604: (1) bias+second threshold write, (2) bias+first threshold write, (3) bias−second threshold write, (4) bias−first threshold write, and (5) bias alone.

In another embodiment, the bias current is only applied during a read sequence. In that case, the write driver will not apply a current to the word line 604 at the same time that the bias driver is applying a current to the word line 604.

As one skilled in the art will understand, the net currents in the word line 604 may be created with any number of current drivers. For example, a single current driver may be configured to generate net currents. Alternatively, three or more drivers may be used.

Figure 7:
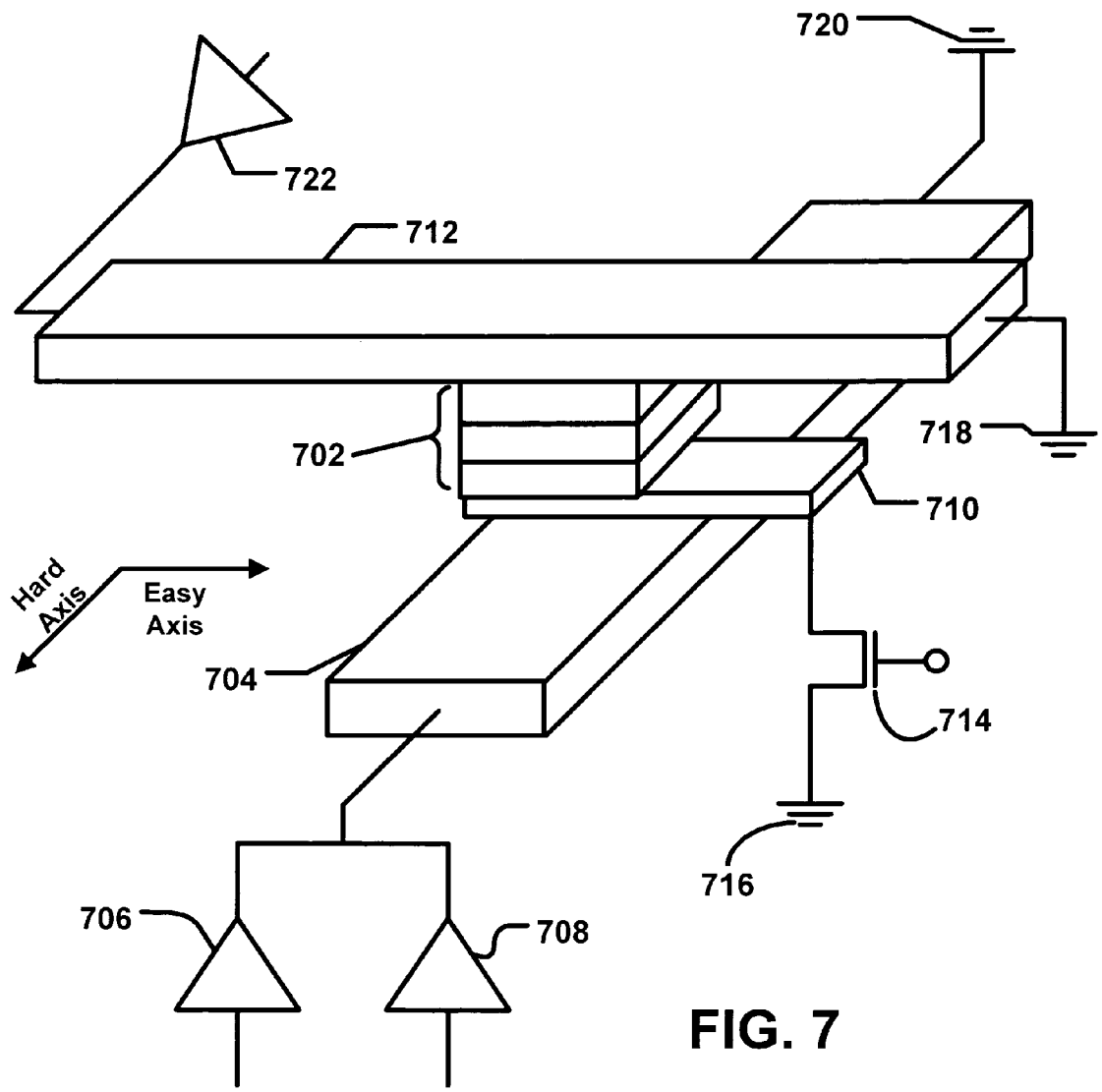
FIG. 7 is an isometric view of a current perpendicular to plane (CPP) memory device in accordance with an embodiment.

FIG. 7 shows an isometric view of an exemplary current perpendicular to plane (CPP) magnetoresistive (MR) device. An MR element 702 may, for example, be a magnetic tunnel junction (MTJ) having a nonmagnetic, nonconducting barrier layer sandwiched between two ferromagnetic layers. A word line 704 is arranged near the MR element 702. Outputs of a bias driver 706 and a current driver 708 are electrically connected to a first end of the word line 704. A first ground 720 is electrically connected to a second end of the word line 704. A bit line 712 is aligned near the MR element 702 and is electrically connected with a first side of the MR element 702. An output of a bit driver 722 is electrically connected to a first end of the bit line 712. A second ground 718 is electrically connected to a second end of the bit line 712. A read layer 710 is electrically connected to a second side of the MR element 702. A read switch 714 is interconnects the read layer 710 and a third ground 716. In a preferred embodiment the grounds 716, 718, and 720 are electrically connected or are the same ground.

In order to correct a biased hysteresis loop of the MR element 702, a bias field is created by passing a bias current through the word line 704. The bias current is generated by the bias driver 706 and passed to the first ground 720.

During a write sequence, a net current is created in the word line 704 that is a summation of the bias current generated by the bias driver 706 and a write current generated by the write driver 708. In an alternative embodiment, a single driver (not shown) creates the net current. The net current in the word line 704 creates a first magnetic field acting on the MR element 702. In the arrangement shown, the first magnetic field would act along an easy axis of the MR element 702. Also during the write sequence, the bit driver 722 generates a bit current that passes through the bit line 712 to the second ground 718. The bit current generates a second magnetic field acting on the MR element 702. In the arrangement shown, the second magnetic field would act along the hard axis of the MR element. A combined effect of the first and second magnetic field is configured to switch a logical state of the MR element 702 by inverting a magnetization direction of one of its magnetic layers. During the write sequence, the read switch 614 is open so that the bit current will flow through the bit line 712 without flowing through the MR element 702.

During a read sequence, the read switch 714 is closed so that the read layer 710 is electrically connected to the third ground 716. The bit driver 722 generates a read current that passes through the bit line 712 to the first side of the MR element 702. The current then passes through the MR element 702 to the third ground 716. A metric may be obtained from the read current flow that is indicative of the resistance across the MR element 702. The resistance across the MR element 702 is indicative of a logical state of the MR device.

In order to substantially center a biased hysteresis curve of the MR element during a read operation, a bias current is generated by the bias driver 706 and passed through the word line 704 to the first ground 720. The bias current is configured to generate a magnetic field known identified as a bias field. In a preferred embodiment, when applied to the MR element 702, the bias field centers the biased hysteresis curve.

Figure 8:
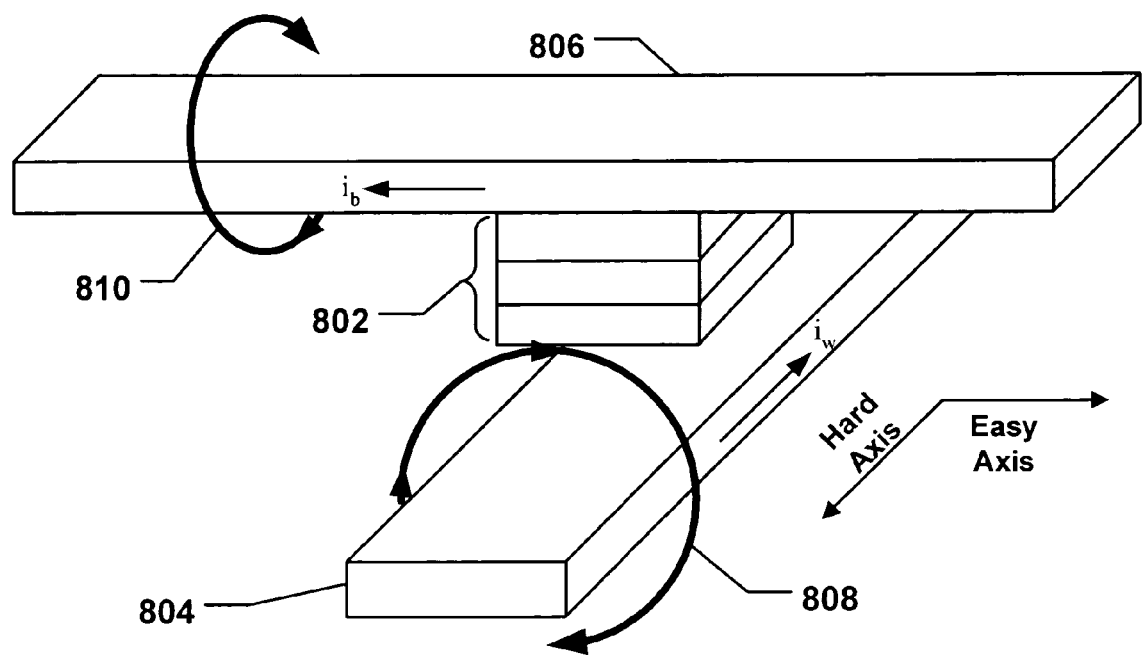
FIG. 8 is an isometric view of a memory device showing magnetic fields in accordance with an embodiment.

Referring now to FIG. 8, a bit line 806 is coupled to a MR element 802. A word line 804 is arranged near the MR element 802, but is electrically isolated from the MR element 802. A magnetic field used to switch the magnetization direction the a layer of the MR element 802 is created by a word current ($i_w$) flowing through the word line 804 acting in combination with a bit current ($i_b$) flowing through the bit line 806. Each current creates a magnetic field (808 and 810) acting perpendicularly to the current flow according to the "right hand rule." The two magnetic fields 808 and 810 additively form a combined magnetic field that acts on the storage layer of the element.

In one embodiment, the bit line 806 creates a first magnetic field along a hard axis of the MR element 802, and the word line 804 creates a second magnetic field along an easy axis of the MR element 802. In this embodiment, the first magnetic field acts to lower the switching threshold of the MR element 802 while the second magnetic field acts to switch the magnetization direction of the MR element 802. Neither magnetic field is configured to, on its own, switch the magnetization direction. As mentioned above, the MR element 802 may be arranged in a fashion other than orthogonal.

Although conducting lines have been shown above and below the MR elements in the above embodiments, one skilled in the art will realize that this orientation may be altered. For example, a word line may be displayed flowing above or to the side of the MR element.

3. Exemplary Process Flow

Figure 9:
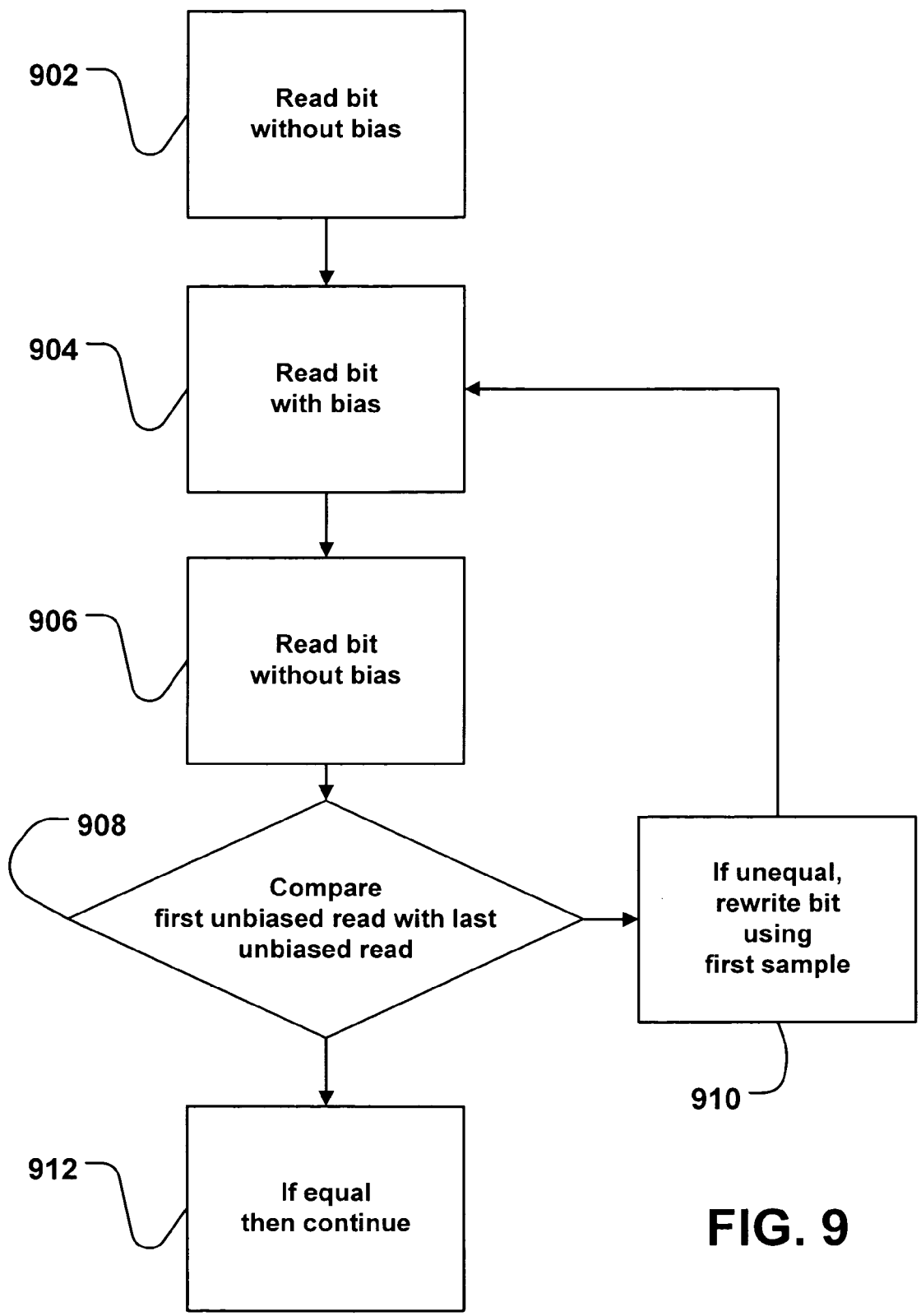
FIG. 9 is a process flow diagram of a rewrite process in accordance with an embodiment.

Because the bias current is applied to the same word line as the write current, it is possible that the bias current will switch the binary or logical state of the MR element. Thus, an embodiment provides for a rewrite feedback loop to reset the MR element if necessary. FIG. 9 shows an exemplary process flow with feedback correction during a read sequence. Step 902 shows an MR element (also known as a bit) being read without applying the bias current. This pre-biased state is stored and serves as a baseline. Step 904 shows a second read sequence being performed. This second read sequence is done with the bias current applied. Because the hysteresis loop is centered by the bias current, the value read from the second read sequence is taken as the value of the bit. I.e. the binary state of the bit is determined from the second value.

After the second value is obtained, a third read sequence is performed at step 906—again without bias. The two unbiased reads are compared at step 908 to determine whether applying the bias in step 904 changed the state of the bit. If the two unbiased reads are equal then there is no need to enter the feedback loop shown in step 910. However, if the two unbiased reads are unequal then the bit should be rewritten to the pre-biased state as shown in step 910. After rewriting, the process reenters step 904 by reading the state of the bit with bias again, and the process continues. In an embodiment, a stop may end the process after a number of failed rewrites.

A read sequence can take various forms depending upon the architecture of the MR element and other parameters of the device. For example, a spin valve may be arranged to use a latch read-back scheme that stores the value of the MR element in a latch. Alternatively an auto-zero scheme may be employed in a pseudo spin valve to determine the value of the element. Auto-zeroing involves inverting a magnetization direction of a sense layer of the MR element in order to determine the orientation of the reference layer.

In addition to the data security provided by the feedback loop, redundancy may be build into the device structure. In an embodiment, two complementary MR elements store complementary data. Thus, if a "1" is stored in a primary element, then a "0" is stored in a corresponding complementary element. In an embodiment of the feedback loop, a comparator determines whether the bias current altered a state of an MR element by comparing the state of the primary element with the state of the complementary element. If the two states are equal then the elements must be rewritten. However, no action should be taken if the state of the primary element is opposite that of the complementary element.

4. Exemplary MRAM Memory Element Architectures

Figure 10:
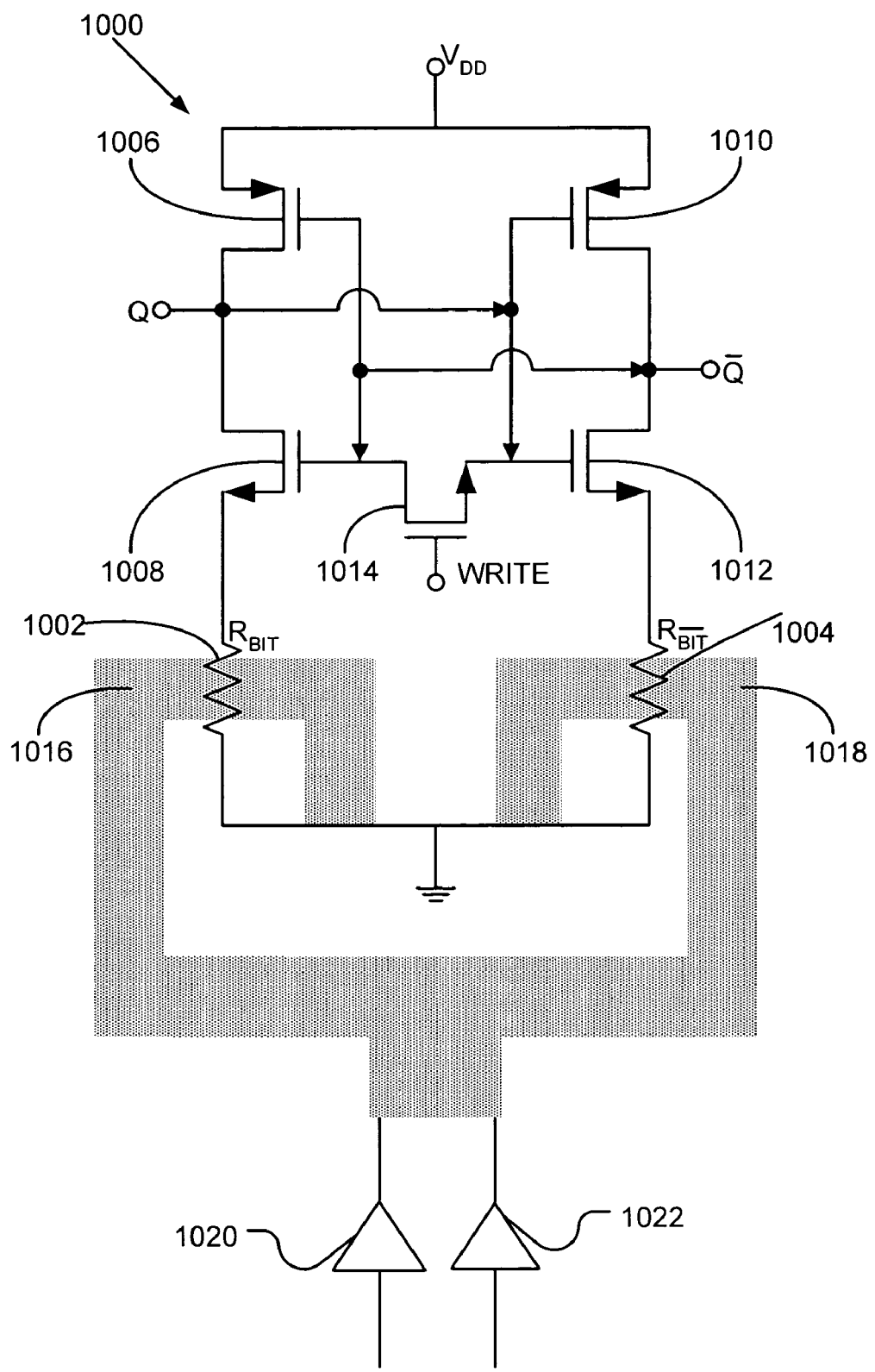
FIG. 10 is a schematic diagram of a "2R5T" memory element in accordance with an embodiment.

One application of an embodiment is in magnetic random access memory (MRAM) memory elements. FIG. 10 is a schematic diagram showing an exemplary MRAM memory element 1000, in which an embodiment can be employed. Memory element 1000 includes magnetoresistive elements 1002 and 1004, which may, for example, be spin valves, pseudo spin valves, or magnetic tunnel junctions. Memory element 1000 also includes transistors 1006, 1008, 1010, and 1012 connected together in a latching configuration. In addition, a reset or write transistor 1014 is connected between the gate terminals of transistors 1008 and 1012. Because of the presence of two resistors and five transistors, this memory element configuration may be referred to as a "2R5T" architecture.

In this configuration, transistors 1006 and 1008 function as a first inverter, which is connected to a power supply terminal, $V_{DD}$, and connected to ground via magnetoresistive element 1002. Transistors 1010 and 1012 function as a second inverter, which is connected to a power supply terminal, $V_{DD}$, and connected to ground via magnetoresistive element 1004. The first and second inverters are connected together in a cross-coupled configuration as shown in FIG. 9. In addition, transistor 1014 is arranged so that, when transistor 1014 is turned on, it substantially equalizes the voltages at the inputs of the first and second inventors.

Memory element 1000 also includes word lines 1016 and 1018 arranged near magnetoresistive elements 1002 and 1004, respectively. Word lines 1016 and 1018 are arranged such that currents flowing to ground apply magnetic fields to magnetoresistive elements 1002 and 1004 in opposite directions. In this way, write currents of the same magnitude flowing through word lines 1016 and 1018 program magnetoresistive elements 1002 and 1004 into opposite logical states. Because word lines 1016 and 1018 are coupled, they may also be termed a single word line.

A bias driver 1020 is provided for delivering a bias current to word lines 1016 and 1018. The bias current is applied to shift the hysteresis loop profiles of magnetoresistive elements 1002 and 1004 without switching their logical state. Additionally, a write driver 1022 is provided for delivering a write current to word lines 1016 and 1018. The write current is applied to switch the logical state of magnetoresistive elements 1002 and 1004. During a write sequence, a net current is passed through the word lines 1016 and 1018 which is the summation of the bias current and the write current. Because the bias current causes magnetoresistive elements 1002 and 1004 to exhibit substantially symmetric hysteresis characteristics, as illustrated by FIG. 4, this use of word currents to program magnetoresistive elements 1002 and 1004 into opposite logical states may be facilitated.

To use memory element 1000, magnetoresistive elements 1002 and 1004 are first programmed into the desired logical states by a combination of write currents and bias currents flowing through word lines 1016 and 1018. Then, when the first and second inverters are either powered up by $V_{DD}$ or reset by turning on transistor 1014, the first and second inverters assume a latched state that corresponds to the logical states of magnetoresistive elements 1002 and 1004. The latched state of memory element 1000 may be sensed at the "Q" terminals.

Figure 11:
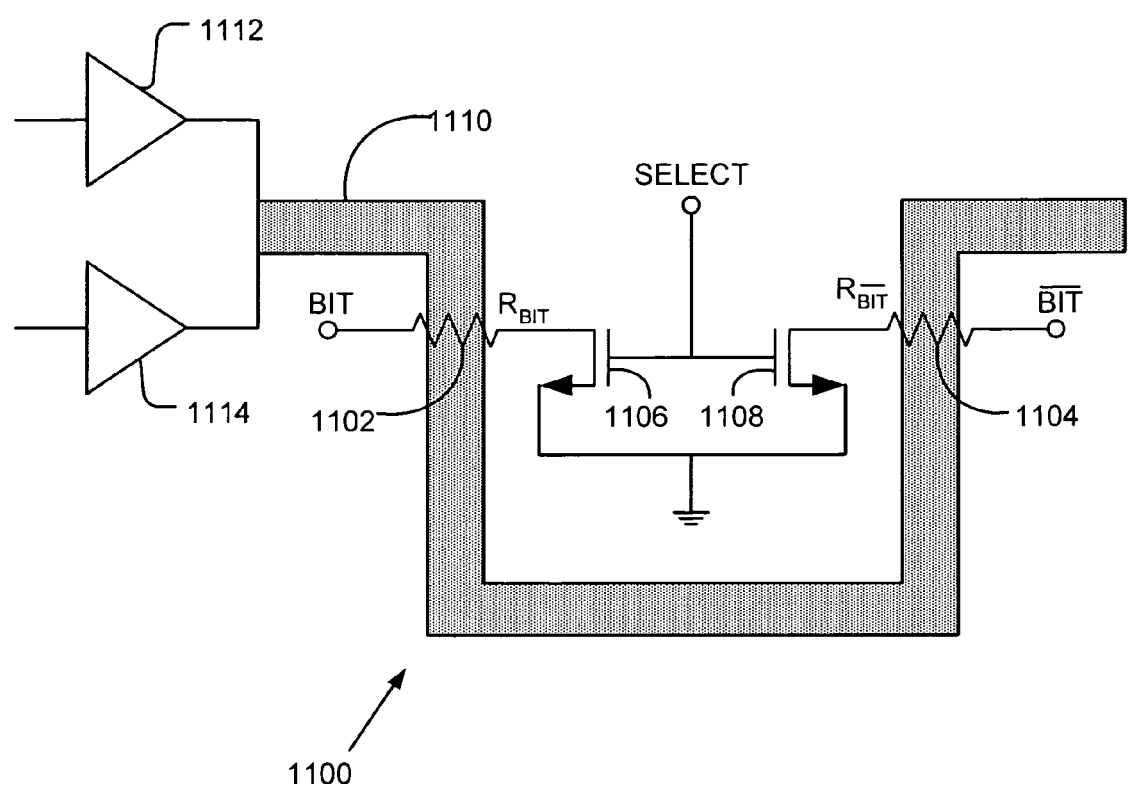
FIG. 11 is a schematic diagram of a "2R2T" memory element in accordance with an embodiment.

FIG. 11 shows another exemplary MRAM memory element 1100 in which the bias-adjusted spin valves and pseudo spin valves may be used. Memory element 1100 includes magnetoresistive elements 1102 and 1104, which may, for example, be spin valves or pseudo spin valves. Magnetoresistive elements 1102 and 1104 are connected to ground via transistors 1106 and 1108, respectively. The gate terminals of transistors 1106 and 1108 are connected to a "SELECT" line that may be used to turn these transistors on and, thereby, sense the resistance of magnetoresistive elements 1102 and 1104. Because of the presence of two resistors and two transistors, this memory element configuration may be referred to as a "2R2T" architecture.

A word line 1110 is arranged near magnetoresistive elements 1102 and 1104 so that a current flowing through word line 1110 applies magnetic fields to magnetoresistive elements 1102 and 1104 in opposite directions. In this way, the same write current may be used to program magnetoresistive elements 1102 and 1104 into opposite logical states. A bias driver 1112 is coupled with word line 1110 and provides a bias current. The bias current creates a magnetic field that shifts the hysteresis loop of magnetoresistive elements 1102 and 1104. A write driver 1114 is also coupled with word line 1110 and provides a write current for switching the logical state of magnetoresistive elements 402 and 404. In one embodiment, during a write sequence, a net current is passed through the word line 1110, wherein the net current is the sum of the bias current and the write current. The two drivers 1112 and 1114 may be replaced with a single driver or alternatively, more than two drivers. Additionally, one driver may be coupled with a first end of word line 1110 while another driver is connected with a second end of the word line 1110. In a preferred embodiment, both drivers 1112 and 1114 are coupled to a first end of the word line 1110 and a ground (not shown) is coupled to a second end of the word line 1110.

Because the bias current causes magnetoresistive elements 1102 and 1104 to exhibit substantially symmetric hysteresis characteristics, as illustrated by FIG. 4, the ability to use the same write current to program magnetoresistive elements 1102 and 1104 into opposite logical states may be facilitated.

Once magnetoresistive elements are programmed in this way, memory element 1100 may be selected by a "SELECT" voltage that turns on transistors 1106 and 1108. The resistances of magnetoresistive elements 1102 and 1104, and, thus, the logical state of memory element 1100, may then be sensed through the "BIT" lines. In practice, the "BIT" lines may be connected to a latch to provide a latched output. In order to shift the read hysteresis loop, the bias driver configured to deliver a bias current at same time that the "SELECT" voltage turns on the two transistors. An embodiment further provides a summing device for combining the bias current and the write current before they are delivered to the word line.

Figure 12:
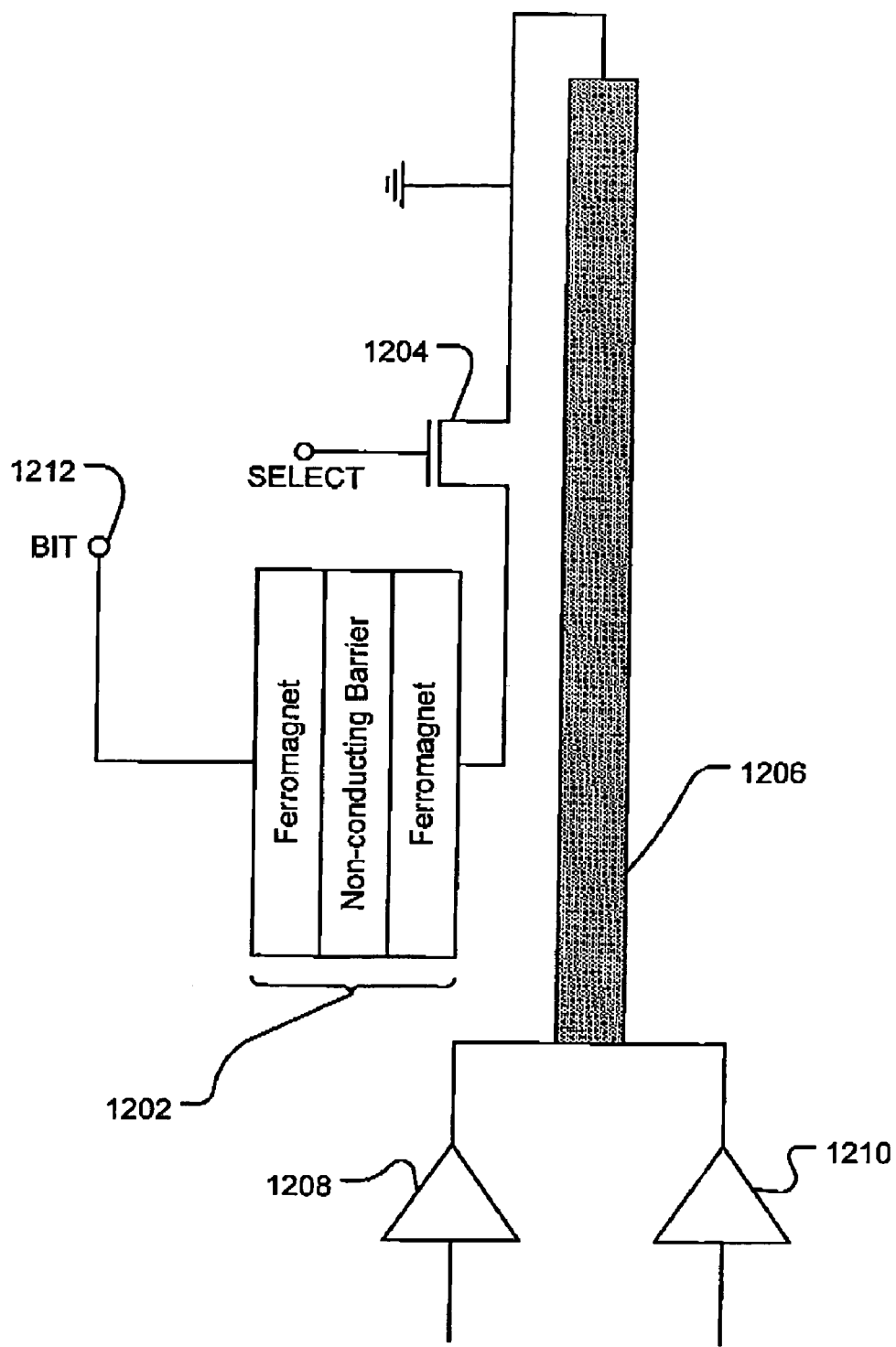
FIG. 12 is a schematic diagram of a magnetic tunnel junction architecture in accordance with an embodiment.

FIG. 12 shows an exemplary MRAM element using a magnetic tunnel junction (MTJ) 1202 arranged as a current perpendicular to plane (CPP) device. The MTJ 1202 is a magnetoresistive element having a thin barrier layer sandwiched between two conducting magnetic layers. The MTJ 1202 is connected to ground via a transistor 1204. The gate terminal of transistor 1204 is connected to a "SELECT" line that may be used to turn this transistor on and, thereby sense the resistance of magnetoresistive elements 1202 when a read current is passed through the "BIT" line 1212. A word line 1206 is arranged near the MTJ 1202 such that a current in the word line 1206 will apply a magnetic field on the MTJ 1202. Two current drivers are connected to the word line: a bias driver 1208 and a write driver 1210. The bias driver 1208 provides a bias current in the word line so as to center a biased hysteresis loop of the MTJ 1202. The element is configured such that a bias current applied by the bias driver 1208 will not switch the logical state of the MTJ 1202. The write driver 1210 provides a write current to the word line 1206. The write current is applied with sufficient magnitude to switch the logical state of the MTJ 1202.

It is possible that the logical state of an MR element will switch while applying a bias field to the MR element. Thus, another embodiment provides additional hardware for determining whether the MR element switched its logical state and for returning the MR element to its original state. A data storage medium such as that shown in FIG. 12 is provided for storing the logical state of the MR element prior to applying the bias field. A comparator is also provided for comparing the stored logical state (pre-biased state) with the new logical state (post-biased state) of the MR element. If the two states are different, the logical state of the MR element should be reset to its pre-biased state. Thus, a rewrite trigger is provided for causing the write driver to deliver a sufficient current to the word line to switch the MR element from the post-biased state to the pre-biased state.

5. Exemplary MRAM Array

Figure 13:
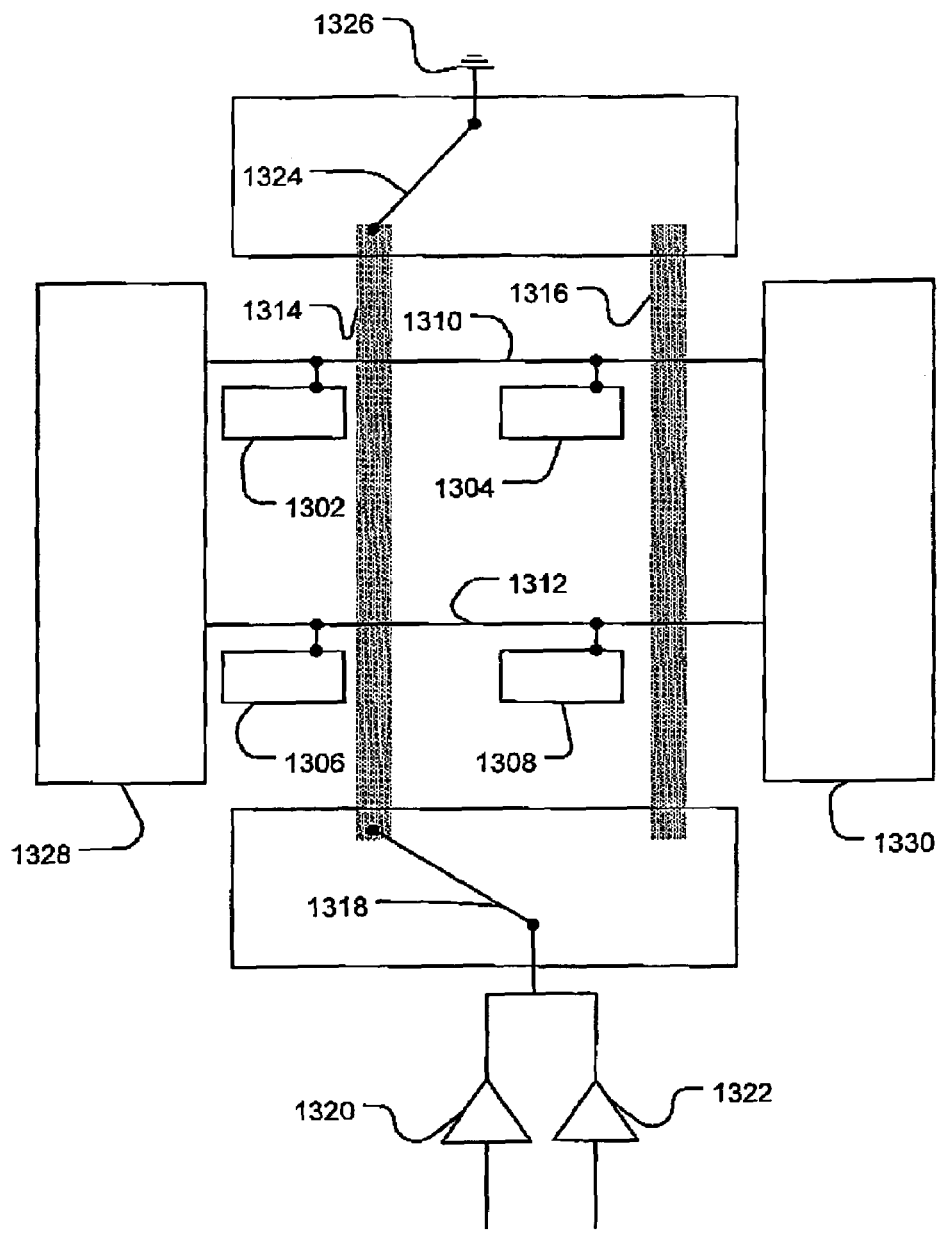
FIG. 13 is a schematic diagram of a magnetic memory array architecture in accordance with an embodiment.

FIG. 13 shows a simplified block diagram of an embodiment of a memory array in which an embodiment can be employed. A 2×2 array of magnetoresistive elements are shown by elements 1302, 1304, 1306, and 1308. The elements may, for example, be embodied as GMR elements or MTJ elements. Each row of elements 1302–1308 has a bit line 1310, 1312 running its distance and coupled to each element in the row. Bit line control circuitry 1328, 1330 is used to selectively pass a current through a bit line 1310, 1312. For example, a current is passed through bit line 1310 when during read/write operations of either element 1302 or 1304. Each column of the array has a word line 1314, 1316 running its distance and arranged near each element in the column. For example, word line 1314 is arranged near elements 1302 and 1306. A first switch 1318 is shown connected to word line 1314; however, the first switch can generally connect to any word line in the matrix. The switch interconnects a selected word line (in this case word line 1314) with both a bias driver 1320 and a write driver 1322.

Although only the word lines 1314, 1316 are shown as planar conducting lines, in a preferred embodiment, the word lines 1314, 1316 and bit lines 1310, 1312 are both planar conducting lines that have a substantially greater width than height. Additionally, the word lines 1314, 1316 and bit lines 1310, 1312 may pass above or below their respective elements 1302, 1304, 1306, and 1308.

The write driver 1322 is configured to pass a write current through the selected word line. The write current should be of sufficient magnitude to cause the magnetization of a layer of a selected magnetoresistive element to switch direction—thus switching the logical state of the selected magnetoresistive element. The bias driver 1320 is configured to generate a bias current during read/write cycles in order to center a hysteresis loop of a selected magnetoresistive element. In general, the bias current generated by the bias driver 1320 is insufficient to switch the magnetic orientation of the selected magnetoresistive element. During a read sequence, the logical state of the selected magnetoresistive element is held constant by its own coercivity.

A second switch 1324 is shown connected to word line 1314; however, the second switch can generally connect to any word line in the matrix. The switch interconnects a selected word line with a ground 1326 and allows a current to pass through the word line.

Although a 2×2 array is shown, it will be recognized by those skilled in the art that a much larger array may be used. In that case, there may be a plurality of first switches, with each switch having the ability to interconnect the current drivers 1320 and 1322 with a subset of the word lines. Likewise a plurality of second switches would be provided, each switch having the ability to interconnect the ground with a subset of the word lines.

6. Conclusion

A variety of embodiments have been described above. More generally, those skilled in the art will understand that changes and modifications may be made to these embodiments without departing from the true scope and spirit of the present invention, which is defined by the claims. Thus, references to, for example, specific thicknesses, materials, and fabrication methods are meant to be illustrative rather than limiting.

I claim:

1. In a magnetoresistive memory device, a method comprising applying a bias current to a word line of the memory device to impose a bias field on a magnetoresistive element for centering a hysteresis loop of the magnetoresistive element.

2. The method of claim 1, further comprising:
making a determination that that the device switched from a first stale to a second state while applying the bias current; and
in response to the determination, triggering a rewrite to restore the memory device to the first slate.

3. The method of claim 1, wherein the step of applying a bias current occurs during a read sequence of the memory device, and wherein the hysteresis loop is a read hysteresis loop.

4. The method of claim 3, further comprising holding a binary state of the memory device constant while applying the bias current.

5. The method of claim 1, wherein the step or applying a bias current occurs during a write sequence of the memory device, and wherein the hysteresis loop is a write hysteresis loop.

6. The method of claim 1, wherein the memory device is a giant magnetoresistive memory device.

7. The method of claim 1, wherein the memory device is a magnetic tunneling junction device.

8. The method of claim 1, wherein the bias current is within the approximate range of 5 mA to 40 mA.

9. A magnetoresistive device comprising:
a magneloresistive element;
a word line arranged near the magnetoresistive element for switching a state of the magnetoresistive element and for applying a bias field to the magnetoresistive element;
a bias driver electrically connected to the word line for applying a bias current to the word line, the bias current being configured to impose a bias on the magnetoresistive element for centering a hysteresis loop of the magrietoresistive element, wherein the bias driver is configured to apply the bias current during a write cycle of the write driver, wherein the magnitude and direction of the bias current is configured to substantially limit a write hysteresis loop bias of the magnetoresistive element; and
a write driver electrically connected to the word line for applying a switching current to the word line.

10. The magnetoresistive device of claim 9, wherein the bias driver is configured to apply the bias current during a read cycle of the magnetoresistive device, wherein the magnitude and direction of the bias current is configured to substantially limit a read hysteresis loop bias of the magnetoresistive element.

11. The magnetoresistive device of claim 9, wherein the magnetoresistive element is a giant magnetoresistive element.

12. The magnetoresistive device of claim 9, wherein the magnetoresistive element is a magnetic tunneling junction.

13. The magneloresistive device of claim 9, wherein the magnetoresistive element is an anisotropic magnetoresislive element.

14. The magnetoresistive device of claim 9, wherein the magnetoresistive element comprises:
a nonmagnetic nonconducting barrier layer sandwiched between two ferromagnetic conducting layers.

15. The magnetoresistive device of claim 9, wherein the magnetoresistive element comprises:
a nonmagnetic conducting layer sandwiched between a first ferromagnetic layer and a second ferromagnetic layer, wherein the coereivity of the first layer is greater than the coercivity of the second layer.

16. The magnetoresistive device of claim 9, wherein the magnetoresistive element comprises:
an antiferromagnetic layer;
a ferromagnetic pinned layer coupled to the antiferromagnetic layer;
a nonmagnetic conducting layer coupled to the pinned layer; and
a ferromagnetic free layer coupled to the nonmagnetic conducting layer.

17. The magnetoresistive device of claim 9, further comprising:
means for making a determination that the magnetoresistive element switched from a first state to a second state while applying the bias field; and
means for returning the magnctoresistive element to the first state in response to the determination.

18. The magnetoresislive device of claim 17,
wherein the means for making a determination comprise a data storage medium for storing a pre-biasing state of the magnetoresistive element; and a comparator for comparing the pre-biasing state with a post-biasing state of the magnetoresistive element, and wherein the means for returning the magnetoresistive element to the first state comprise a rewrite trigger for causing the write driver to deliver a sufficient current to the word line to switch the magnetoresistive element from the second state to the first state.

19. A magnetoresistive device comprising:

a primary magnetoresistive element, wherein the primary magnetoresistive element is configured to switch between a first state with a low zero-field resistance and a second state with a high zero-field resistance when a magnetic field of sufficient strength is applied to the primary magnetoresistive element;

a complementary magnetoresistive element, wherein the complementary magnetoresistive element is configured to switch between a first state with a high zero-field resistance and a second state with a low zero-field resistance when a magnetic field of sufficient strength is applied to the complementary magnetoresistive element;

a primary bit line electrically connected to the primary magnetoresistive element;

a complementary bit line electrically connected to the complementary magnetoresistive element;

a word line electrically isolated from the primary magnetoresistive element and electrically isolated from the complementary magnetoresistive element, and wherein the word line is aligned near the primary magnetoresistive element and near the complementary magnetoresistive element, and wherein a current in the word line causes a magnetic field to be applied to the primary magnetoresistive element and to the complementary magnetoresistive element, and wherein the magnetic field applied to the primary magnetoresistive element is of the same magnitude but opposite sign to the magnetic field applied to the complementary magnetoresistive element;

a bias driver electrically connected to the word line for generating a bias current in the word line; and a write driver electrically connected to the word line for generating a write current in the word line.

20. The magnetoresistive device of claim 19, further comprising a summing device for additively combining the bias current and write current, wherein the bias driver and write driver are each electrically connected to the summing device as inputs and the word line is electrically connected to the summing device as an output.

21. The magnetoresistive device of claim 19, further comprising:

a comparator for determining whether a change occurred to either a state of the primary magnetoresistive element or to a state of the complementary magnetoresistive element after applying the bias current; and a rewrite trigger for causing the write driver to generate a current sufficient to return the states of the primary and secondary magnetoresistive elements to their pre-biased states.

22. The magnetoresistive device of claim 19, wherein the bias drive is configured to create a bias current in the word line of sufficient magnitude to substantially center a hysteresis loop of the primary magnetoresistive element and to substantially center a hysteresis loop of the complementary magnetoresistive element.

23. A magnetoresistive memory array comprising:

a plurality of magnetoresistive memory cells arranged in rows and columns;

a plurality of bit lines, wherein each bit line aligned in one row and coupled to each memory cell in the row;

a plurality of word lines, wherein each word line is arranged near a column of memory cells, wherein a current passing through a word line creates a magnetic field acting along an easy axis of each of the memory cells in the column of memory cells;

a write driver for generating a write current, wherein the output of the write driver is electrically connected to one or more of the plurality of word lines; and a bias driver, wherein the output of the bias driver is electrically connected to one or more of the plurality of word lines, the bias driver being configured to generate a bias current that substantially centers a biased hysteresis loop of a selected magnetoresistive memory cell.

24. The array of claim 23, wherein the write driver is configured to deliver a first current with a first magnitude and a first direction, and the write driver is configured to deliver a second current with a second magnitude and a second direction, wherein the first magnitude is equal to the second magnitude and the first direction is opposite to the second direction.

25. The array of claim 23, further comprising:

a write line interconnected between the output of the write driver and the output of the bias driver; and a switch rot interconnecting the write line to a selected word line.

* * * * *

UNITED STATES PATENT AND TRADEMARK OFFICE
CERTIFICATE OF CORRECTION

PATENT NO. : 7,068,531 B2
APPLICATION NO. : 10/754935
DATED : June 27, 2006
INVENTOR(S) : Romney Katti It is certified that error appears in the above-identified patent and that said Letters Patent is hereby corrected as shown below:

Column 15, line 50, please delete "that that", replace with -- that--.

Column 15, line 62, please delete "or", replace with -- of --.

Column 16, line 6, please delete "magneloresistive", replace with -- magnetoresistive --.

Column 16, line 13, please delete "bias", replace with -- bias field --.

Column 16, line 15, please delete "magrietoresistive", replace with -- magnetoresistive --.

Column 16, line 34, please delete "magneloresistive", replace with -- magnetoresistive --.

Column 16, line 35, please delete "magnetoresislive", replace with -- magnetoresistive --.

Column 16, line 45, please delete "coereivity", replace with -- coercivity --.

Column 18, line 47, please delete "rot", replace with -- for--.

Signed and Sealed this

Nineteenth Day of June, 2007

JON W. DUDAS
*Director of the United States Patent and Trademark Office*